US006818499B2

United States Patent
Kim

(10) Patent No.: US 6,818,499 B2
(45) Date of Patent: Nov. 16, 2004

(54) METHOD FOR FORMING AN MIM CAPACITOR

(75) Inventor: Seok-Su Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/624,676

(22) Filed: Jul. 23, 2003

(65) Prior Publication Data

US 2004/0137693 A1 Jul. 15, 2004

(30) Foreign Application Priority Data

Jul. 25, 2002 (KR) .................................. 10-2002-0043799

(51) Int. Cl.[7] ........................................ H01L 21/8242
(52) U.S. Cl. ................................... 438/239; 438/396
(58) Field of Search ................................ 438/239, 250, 438/253, 393, 396

(56) References Cited

U.S. PATENT DOCUMENTS 6,144,051 A    11/2000 Nishimura et al.
6,333,224 B1 * 12/2001 Lee ............................. 438/243
6,479,850 B2 * 11/2002 Lee ............................. 257/296
6,569,746 B2 *  5/2003 Lee et al. .................... 438/398
6,597,032 B1 *  7/2003 Lee ............................. 257/303

* cited by examiner

*Primary Examiner*—David S. Blum
(74) *Attorney, Agent, or Firm*—Pillsbury Winthrop LLP

(57) ABSTRACT

A method for forming a metal-insulator-metal ("MIM") capacitor is provided. In the method, a first metal film and an dielectric film are sequentially formed on a semiconductor substrate. A trench through which the first metal film is exposed is formed by patterning the dielectric film. A insulation film and a second metal film are sequentially formed on a surface of the trench and the dielectric film. A mask pattern defining a capacitor forming area is provided on the second metal film. The second metal film and the insulation film are etched by using the mask pattern and the dielectric film as an etching barrier and an etching stopper layer, respectively, to form an upper electrode. With the mask pattern removed, a lower electrode is formed by patterning the dielectric film and the first metal film.

5 Claims, 3 Drawing Sheets

METHOD FOR FORMING AN MIM CAPACITOR

FIELD OF THE INVENTION

The present invention relates to a method for forming a metal-insulator-metal ("MIM") capacitor; and, more particularly, to a method for forming an MIM capacitor capable of preventing an undesired etching of a lower metal film and an occurrence of a bridge between electrodes due to a re-deposition of an etched metal film.

BACKGROUND OF THE INVENTION

An analog capacitor typically has an MIM structure instead of a polysilicon-insulator-polysilicon ("PIP") structure. This is because a capacitor used for an analog circuit in RF band requires a high quality factor; and, in order to obtain such capacitor, a metal electrode having no depletion and low resistance should be used as an electrode material therefor.

A conventional method for forming an MIM capacitor will now be described with reference to FIGS. 1A to 1C.

Referring to FIG. 1A, a semiconductor substrate 1 with an underlying layer (not shown) is prepared; and a first metal film 2, a insulation film 3 and a second metal film 4 are sequentially formed on the substrate 1.

Referring to FIG. 1B, a mask pattern (not shown) is provided on the second metal film 4 by using a known process, and the second metal film 4 and the insulation film 3 are in turn etched by using the mask pattern, thereby forming an upper electrode 4a of the MIM capacitor over the first metal film 2.

Referring to FIG. 1C, with the mask pattern removed, the first metal film 2 is patterned in accordance with a known photolithography process to form a lower electrode 2a of the MIM capacitor, thereby resulting in the MIM capacitor 10.

In the conventional MIM capacitor forming process, the metal film for the upper electrode and the insulation film are simultaneously etched and the insulation film is over-etched for a complete etching thereof. In this procedure, as shown in FIG. 1B, the surface of the metal film for the lower electrode may be etched and then re-deposited, thereby producing a bridge between the upper and the lower electrode. Accordingly, the reliability and the yield of the MIM capacitor are deteriorated.

SUMMARY OF THE INVENTION

It is, therefore, an object of the present invention to provide a method for forming an MIM or PIP capacitor which is capable of preventing an undesired etching of a lower film and an occurrence of a bridge between electrodes due to re-deposition of an etched film.

In accordance with an aspect of the present invention, there is provided a method for forming a metal-insulator-metal ("MIM") capacitor comprising the steps of: forming a first metal film and an dielectric film on a semiconductor substrate; patterning the dielectric film to form a trench through which the first metal film is exposed; sequentially forming a insulation film and a second metal film on a surface of the trench and the dielectric film; providing a mask pattern defining a capacitor forming area on the second metal film; forming an upper electrode by etching the second metal film and the insulation film by using the mask pattern and the dielectric film as an etching barrier and an etching stopper layer, respectively; removing the mask pattern; and forming a lower electrode by patterning the dielectric film and the first metal film.

In accordance with another aspect of the present invention, there is provided a method for forming a polysilicon-insulator-ploysilicon ("PIP") capacitor comprising the steps of:

forming a first polysilicon film and an dielectric film on a semiconductor substrate;

patterning the dielectric film to form a trench through which the first polysilicon film is exposed;

forming an insulation film and a second polysilicon film on a surface of the trench and the dielectric film;

providing a mask pattern defining a capacitor forming area on the second polysilicon film;

forming an upper electrode by etching the second polysilicon film and the insulation film by using the mask pattern and the dielectric film as an etching barrier and an etching stopper layer, respectively;

removing the mask pattern; and forming a lower electrode by patterning the dielectric film and the first polysilicon film.

BRIEF DESCRIPTION OF THE DRAWINGS

The above and other objects and features of the present invention will become apparent from the following description of preferred embodiments given in conjunction with the accompanying drawings in which.

DETAILED DESCRIPTION OF THE PREFERRED EMBODIMENTS

A preferred embodiment of the present invention will now be described in detail with reference to the accompanying drawings.

FIGS. 2A to 2D are schematic cross-sectional views showing a process for forming an MIM capacitor in accordance with the present invention.

Figure 1A:
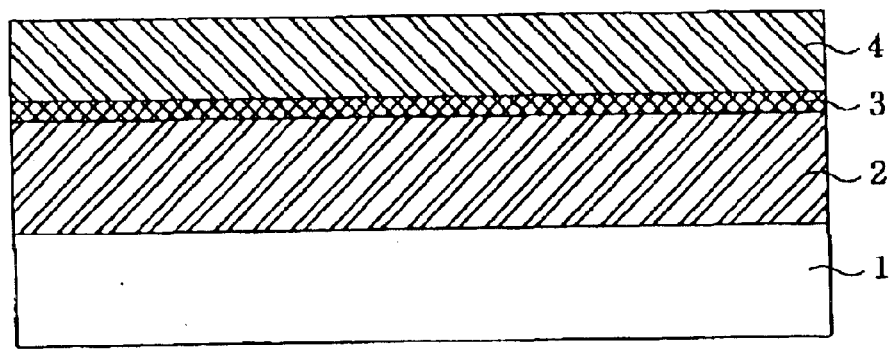
FIGS. 1A to 1C are schematic cross-sectional views showing a conventional process for forming an MIM capacitor.
Figure 1B:
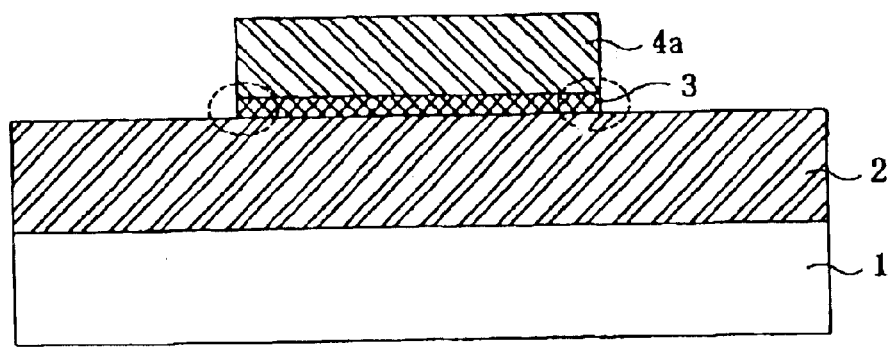
Figure 1C:
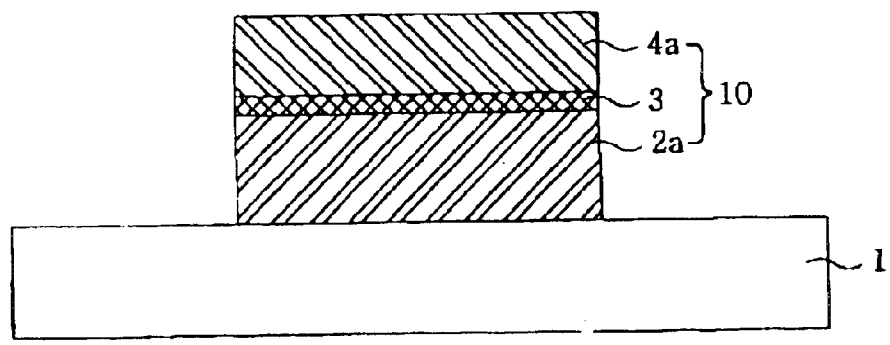
Figure 2A:
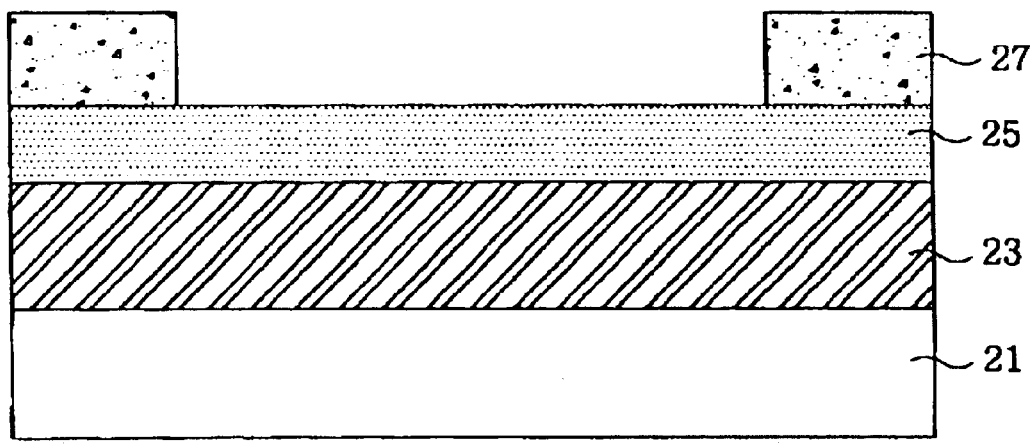
FIGS. 2A to 2D depict schematic cross-sectional views showing a process for forming an MIM capacitor in accordance with a preferred embodiment of the present invention.

Referring to FIG. 2A, a semiconductor substrate 21 with an underlying layer (not shown) is prepared. The underlying layer on the substrate is generally at least one patterned or unpatterned microelectronic layer with metal lines, dielectric layers and/or microelectric components. A first metal film 23 for a lower electrode is deposited on the substrate 21. Then, an dielectric film 25 is deposited on the first metal film 23.

The dielectric film 25 is used as an etching stopper layer upon etching of a second metal film 31 for an upper electrode and a insulation film 29 to prevent an undesired etching of the first metal film 23 for the lower electrode and an occurrence of a bridge between the upper and the lower electrode, which will be described in detail below. Preferably, the dielectric film 25 comprises an oxide film or nitride film.

Subsequently, a first mask pattern 27 for forming a trench is provided on the dielectric film 25.

Figure 2B:
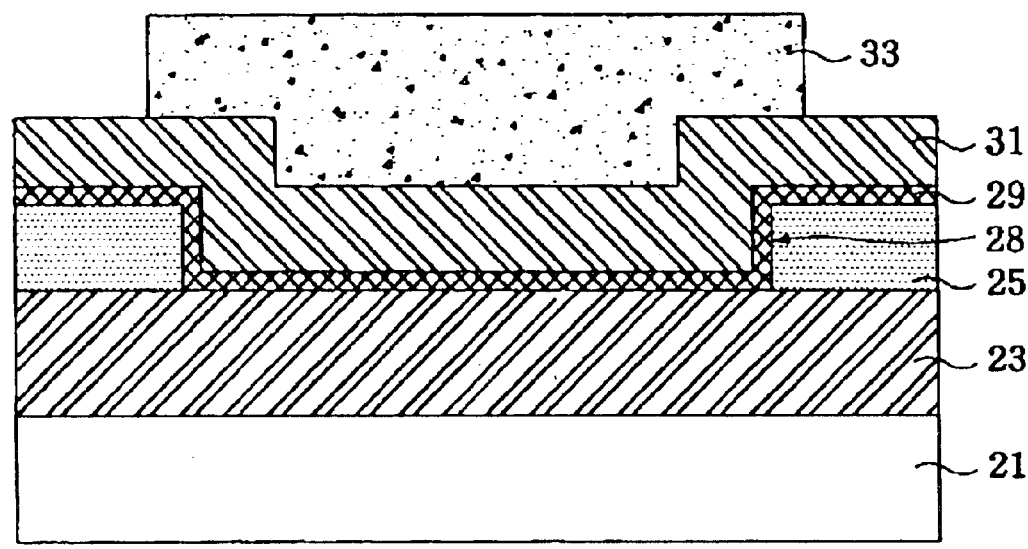

Referring to FIG. 2B, the dielectric film 25 is etched by using the first mask pattern 27 thereon to form the trench through which the first metal film 23 is exposed. Then, with the first mask pattern removed, the insulation film 29 and the second metal film 31 are formed on the surface of the trench and the dielectric film 25.

Next, a second mask film 33 defining a capacitor forming area is provided on the second metal film 31 for the upper electrode.

Figure 2C:
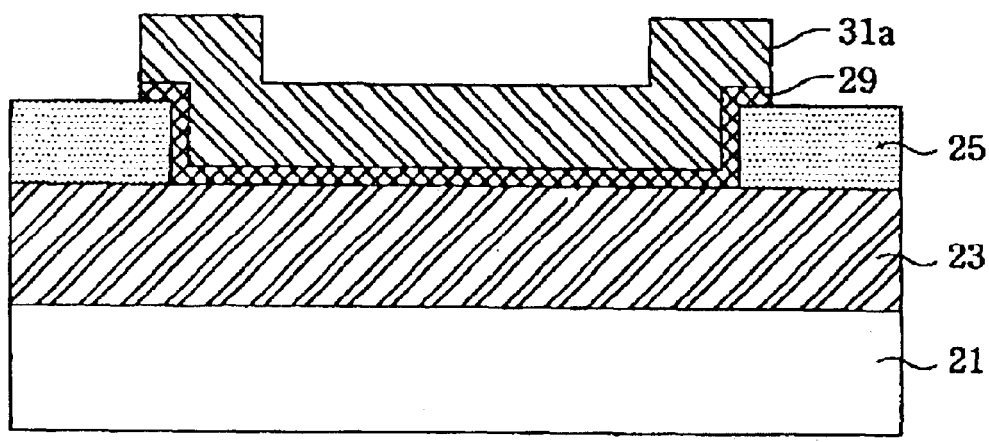

Referring to FIG. 2C, by using the second mask pattern as an etching barrier and the dielectric film 25 as an etching stopper layer, the second metal film 31 and the insulation film 29 are etched to form the upper electrode 31a of the MIM capacitor.

At this time, since the dielectric film 25 is formed on the first metal film 23 for the lower electrode, undesired etching of the first metal film 23 does not occur in the etching process of the second metal film 31 and the insulation film 29; and, therefore, no re-deposition of an etched metal film occurs so that no bridge is generated between the upper and the lower electrode 31a, 23a.

Figure 2D:
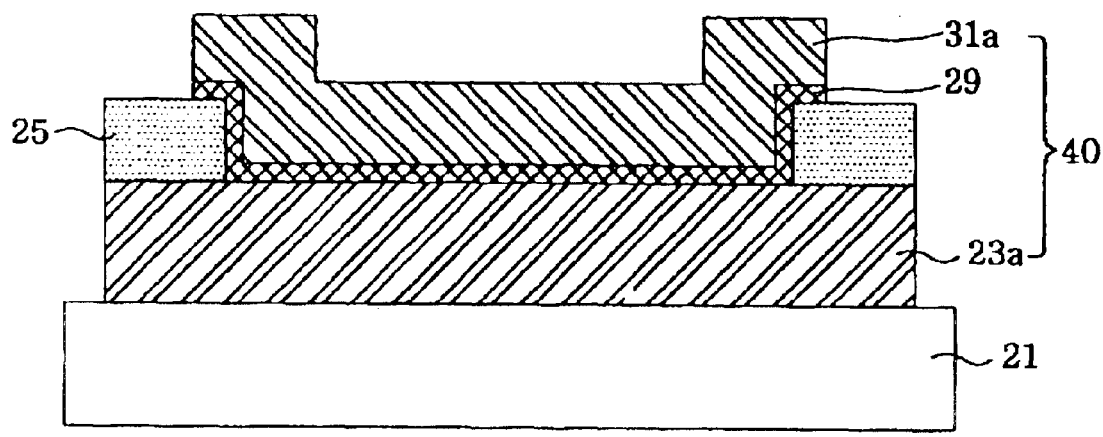

Referring to FIG. 2D, the lower electrode 23a is formed by etching the dielectric film 25 and the first metal film 23 in accordance with to a conventional photolithography process, thereby resulting in the MIM capacitor 40 in accordance with the present invention with the lower electrode 23a, the insulation film 29 and the upper electrode 31a stacked.

Preferably, the thickness of the insulation film is about 10~200 Å and the thickness of the dielectric film is about 20~2000 Å.

In addition, it is appreciated that the capacitor may also be a polysilicon-insulator-polysilicon capacitor. In this case, polysilicon films substitute for the metal films.

As described above, in the process of the present invention, since etching of the insulation film is performed under the condition that the dielectric film is formed on the metal film for the lower electrode, an undesired etching of the metal film for the lower electrode and an occurrence of a bridge between the upper and the lower electrode due to re-deposition of an etched metal film are prevented, thereby enhancing the reliability and the yield of the MIM capacitor.

While the invention has been shown and described with respect to the preferred embodiments, it will be understood by those skilled in the art that various changes and modifications may be made without departing from the scope of the invention as defined in the following claims.

What is claimed is:

1. A method for forming a metal-insulator-metal ("MIM") capacitor comprising the steps of:

forming a first metal film and an dielectric film on a semiconductor substrate;

patterning the dielectric film to form a trench through which the first metal film is exposed;

forming an insulation film arid a second metal film on a surface of the trench and the dielectric film;

providing a mask pattern defining a capacitor forming area on the second metal film;

forming an upper electrode by etching the second metal film and the insulation film by using the mask pattern and the dielectric film as an etching barrier and an etching stopper layer, respectively;

removing the mask pattern; and forming a lower electrode by patterning the dielectric film and the first metal film.

2. The method of claim 1, wherein said dielectric film comprises an oxide film or nitride film.

3. The method of claim 1, wherein a thickness of said insulation film is about 10~200 Å.

4. The method of claim 1, wherein a thickness of said dielectric film is about 20~2000 Å.

5. The method of claim 1, wherein under the metal-insulator-metal-capacitor, an underlying layer is formed which includes at least one patterned or unpatterned microelectronic layer with metal lines, dielectric lines and/or microelectric components.

* * * * *